United States Patent
Mysliwitz et al.

(10) Patent No.: US 7,624,315 B2
(45) Date of Patent: Nov. 24, 2009

(54) ADAPTER CARD FOR CONNECTION TO A DATA BUS IN A DATA PROCESSING UNIT AND METHOD FOR OPERATING A DDR MEMORY MODULE

(75) Inventors: Daniel Mysliwitz, München (DE); Achim Schramm, München (DE)

(73) Assignee: Infineon Technologies AG, Munich (DE)

( * ) Notice: Subject to any disclaimer, the term of this patent is extended or adjusted under 35 U.S.C. 154(b) by 303 days.

(21) Appl. No.: 10/884,110

(22) Filed: Jul. 2, 2004

(65) Prior Publication Data

US 2005/0034025 A1 Feb. 10, 2005

(30) Foreign Application Priority Data

Jul. 3, 2003 (DE) .............................. 103 30 037

(51) Int. Cl.
*G11C 29/00* (2006.01)
*G11C 7/00* (2006.01)
(52) U.S. Cl. ...................... 714/718; 365/201
(58) Field of Classification Search ................ 714/718; 365/201
See application file for complete search history.

(56) References Cited

U.S. PATENT DOCUMENTS 6,775,795 B2 * 8/2004 Doll et al. .................... 714/721
6,794,678 B2 * 9/2004 Hasegawa et al. ............. 257/48
2003/0217313 A1 * 11/2003 Pfeiffer et al. ............... 714/719

FOREIGN PATENT DOCUMENTS

DE 10007177 A1 9/2001
WO WO 02/25296 3/2002

OTHER PUBLICATIONS

"Design, modeling and simulation methodology for source synchoronousDDR memory subsystems" by Pham et al. Electronic Components and Technology Conference, 2000. 2000 Proceedings. 50th Publication Date: 2000 On pp. 267-271 Meeting Date: May 21, 2000-May 24, 2000 ISBN: 0-7803-5908-9 INSPEC Accession No. 6691302.*

* cited by examiner

*Primary Examiner*—Cynthia Britt
(74) *Attorney, Agent, or Firm*—Patterson & Sheridan, L.L.P.

(57) ABSTRACT

One embodiment of the invention provides an adapter card for connection to a data bus in a data processing unit. The adapter includes a DDR interface for connection of a DDR memory module, a memory unit for storing test mode data, a switching device, which, in a first switching state, connects the data bus to the DDR interface and, in a second switching state, decouples the DDR interface from the data bus and connects the memory unit to the DDR interface such that test mode data may be transmitted to a connected DDR memory module to call up a test mode in the DDR memory module. The adapter also includes a control circuit with a trigger input to control the switching device between the switching states depending on a trigger signal.

23 Claims, 2 Drawing Sheets

ADAPTER CARD FOR CONNECTION TO A DATA BUS IN A DATA PROCESSING UNIT AND METHOD FOR OPERATING A DDR MEMORY MODULE

CROSS-REFERENCE TO RELATED APPLICATIONS

This application claims foreign priority benefits under 35 U.S.C. §119 to co-pending German patent application number 103 30 037.6, filed Jul. 3, 2003. This related patent application is herein incorporated by reference in its entirety.

BACKGROUND OF THE INVENTION

1. Field of the Invention

The invention relates to an adapter card for connection to a data bus in a data processing unit. The invention furthermore relates to a method for operating a DDR memory module in different test modes.

2. Description of the Related Art

Test modes of memory chips are functionalities which can be utilized for testing the chips more efficiently or for improved error analysis. These functionalities cannot readily be called up by the user of the memory chips since the functions and the corresponding activation commands for these test modes are not intended to be accessible and in this respect are typically not published by the manufacturer of the memory chips. For example, test modes may serve to vary specific on-chip voltages that are generated to lengthen or to shorten delay times which influence the on-chip sequence control of the memory logic and other operations.

These test modes are usually activated only during the testing of the memory chips in test or analysis systems. In the actual application of the memory chips, an activation of the test modes is not actually envisaged, and the memory controllers provided for driving the memory chips in the later application usually do not afford a possibility for generating the command data for activating a test mode. Generally, the command data are intentionally made so complex that a random or inadvertent activation of a test mode in the later application is practically impossible.

In some instances, for memory chips that have been identified as free of errors in the course of testing after chip production, errors may still occur in subsequent application of the chips. This is due to the fact that, on the test systems, it is not readily possible to model every situation which can occur in a later application. Therefore, the ability to activate the test modes while the memory chip is in the application offers a significant aid for determining the cause of the error that has occurred.

The document DE 100 07 177 A1 discloses a method which makes it possible to set a test mode for a memory chip in a data processing unit. The memory chips can be put into a test mode in a targeted manner with the aid of suitable software and the command data for test mode activation being provided in a memory situated on an additional plug-in card. Said data are then retrieved by a program executed in the data processing unit. After the activation of the selected test mode by means of the code stored in the additional memory, a defined return is made to the calling program.

With the aid of such a method, it is possible to put the memory chip in SDR technology (single data rate technology) in a later application into a test mode and to continue to operate the application. Known methods cannot, however, be applied to memory systems with DDR technology (double data rate technology). Thus, it is usually not possible, by means of the customary controller chips for DDR memory chips, to simultaneously generate any arbitrary information on the address bus when a mode register set command is applied on the command bus. However, since the individual test modes in DDR technology are called up via a combination between a mode register set command on the command bus and a corresponding information item, identifying the specific test mode function, on the address bus, a call-up of test modes in DDR memory chips used in a conventional data processing unit with a customary memory controller by means of the data processing unit itself is not possible. Consequently, the method according to the prior art cannot be used for the activation of test modes in the case of DDR memory chips.

SUMMARY OF THE INVENTION

It is an object of the present invention to provide an apparatus which enables DDR memory chips to be operated in a data processing unit in different test modes. It is furthermore an object of the present invention to provide a method for operating a DDR memory chip in a data processing unit in different test modes.

A first aspect of the present invention provides an adapter card for connection to a data bus in a data processing unit. The adapter card includes a DDR interface for connection of one or more DDR memory modules. The adapter card also includes a memory unit for storing test mode data. Furthermore, a switching unit is provided, which, in a first switching state, connects the data bus to the DDR interface and, in a second switching state, decouples the DDR interface from the data bus and connects the memory unit to the DDR interface in such a way that test mode data can be transmitted to a connected DDR memory module to call up a test mode in the DDR memory module. A control circuit is provided, having a trigger input, to switch the switching device between the switching states in a manner dependent on a trigger signal.

The adapter card according to one embodiment of the invention enables a DDR memory module connected to the DDR interface to be operated in a data processing unit or some other application. The adapter card furthermore makes it possible to set any arbitrary predefined test mode in the DDR memory module and subsequently to continue operating the DDR memory module in the application. In the first switching state, the adapter card connects the data bus of the data processing unit to the DDR memory module in such a way as if the DDR memory module were applied directly, i.e. without an adapter card, to the data bus. In this switching state, it is not possible, in the case of DDR memory chips on the DDR memory module, to call up any arbitrary test mode. This is due to the fact that when a mode register set command is applied on the command bus, it is not possible simultaneously to generate any arbitrary information on the address bus or that information on the address bus which is necessary for calling up the required test mode. This is a limitation of the memory controllers that are usually used in data processing units for driving DDR memory modules.

To circumvent this limitation, a memory unit for storing test mode data is provided on an adapter card. The memory unit is connected to the DDR memory module via the switching device in a second switching state, and, after the connection, the test mode data stored in the memory unit are sent to the DDR memory module. The switching device is controlled via the control circuit, the control circuit setting the test mode in the connected memory module if the control circuit receives a trigger signal via the trigger input.

In one embodiment, the control circuit is configured in such a way as, upon reception of the trigger signal, to switch the switching device into the second switching state and to transmit the corresponding test mode data stored in the memory unit to the DDR interface via the switching device. After the transmission of the test mode data to the DDR interface, the control circuit drives the switching device in such a way as to connect the DDR interface to the data bus again in the first switching state. What is thereby achieved is that, during the operation of the DDR memory module in the data processing unit, a trigger signal can be used to set a test mode which makes it possible, on account of the behavior of the DDR memory module, to fully investigate the cause of an error that has occurred. The memory unit may be configured to have test mode data written to it via the data bus from the data processing unit or via a separate data connection from a further data processing unit, for example. The data bus may comprise a command bus, a useful data bus and/or an address bus. The switching device may be configured to connect the memory unit to the DDR interface in the second switching state in such a way as to be able to call up every test mode in the DDR memory module.

A further aspect of the present invention provides a method for operating a DDR memory module in different test modes. The DDR memory module is firstly coupled to a data bus to exchange data with a data processing unit. For defining a test mode, corresponding test mode data are provided. The test mode in the DDR memory module is called up if a trigger signal is received. In accordance with the trigger signal, the data bus is disconnected from the DDR memory module, and the test mode data provided are sent to the DDR memory module to call up the test mode in the DDR memory module. After the test mode data have been sent, the data bus is connected to the DDR memory module again.

The method according to one embodiment of the invention makes it possible during operation of a DDR memory module in an application, e.g., in a data processing unit, which is operated with a software program, to call up a test mode without expanding the DDR memory module. The test mode may be prescribed merely by providing a trigger signal. Said trigger signal can be generated in a simple manner in the data processing unit. For defining a test mode, corresponding test mode data may be provided by the data processing unit or a further data processing unit.

BRIEF DESCRIPTION OF THE DRAWINGS

A preferred embodiment of the invention is explained in more detail below with reference to the accompanying drawings.

DETAILED DESCRIPTION OF THE PREFERRED EMBODIMENT

Figure 1:
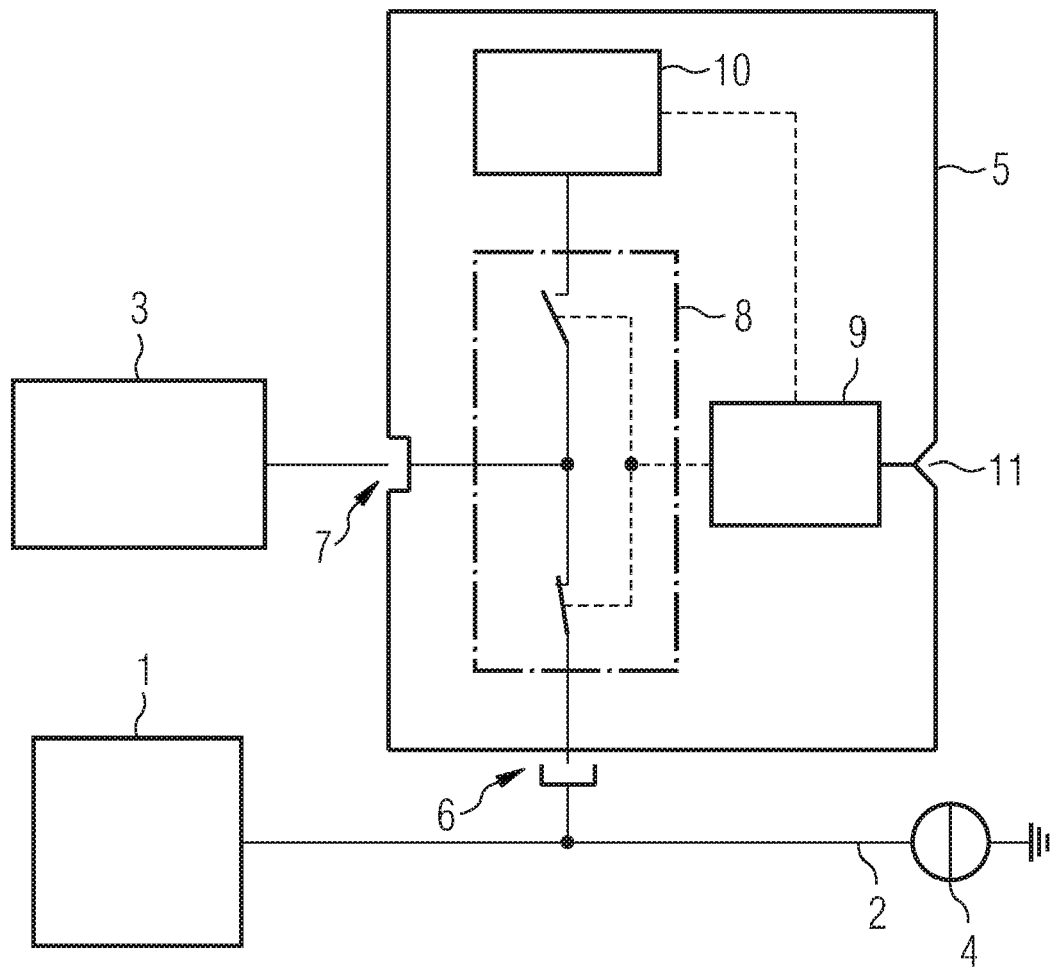
FIG. 1 is a block diagram illustrating an adapter card connected between a data processing unit and a memory module according to one embodiment of the invention.
Figure 2:
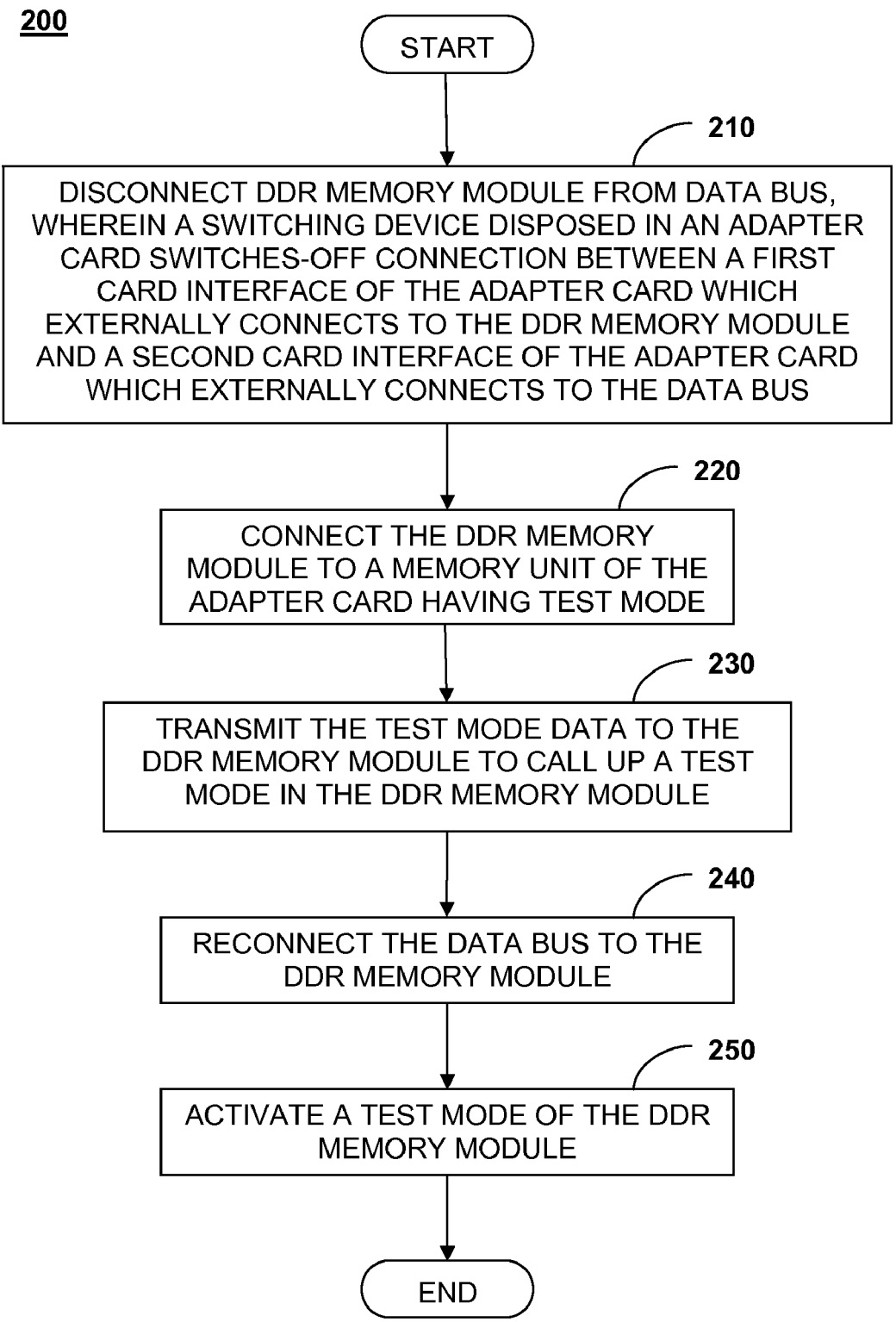
FIG. 2 is a flow chart illustrating a method 200 for operating a DDR memory module connected through an adapter card to a data bus of a data processing unit according to one embodiment of the invention.

FIG. 1 shows a block diagram of a data processing unit 1 with a microprocessor (not shown) and a memory controller (not shown), to which a data bus 2 is provided for communication with a DDR memory module 3. The data bus 2 may include a plurality of bus lines which are each terminated in the customary manner with a termination voltage by means of a termination voltage source 4. The bus lines of the data bus 2 may be organized to include a command bus for transmitting commands directed to the DDR memory module, an address bus for transmitting a memory address and a useful data bus for transmitting data to be stored or read out.

An adapter card 5, according to one embodiment of the invention, is provided between the data bus 2 and the DDR memory module 3. The adapter card 5 may be connected to the data bus 2 via a first interface 6 and has a second interface 7 to which the DDR memory module 3 can be connected. The adapter card 5 may be used for error diagnosis as soon as an error has occurred in the data processing unit during the transmission of data from and to the DDR memory module. To analyze the cause of the error, the test modes in the DDR memory module may be called, and the application may be continued in operation to determine whether the error still occurs in a corresponding test mode.

In normal operation, the first interface 6 is connected to the second interface 7 in such a way that the corresponding bus lines of the data bus 2 are applied to the corresponding associated terminals (not shown) of the DDR memory module 3. In other words, the address bus is connected to the corresponding address bus terminals of the DDR memory module 3; the useful data bus is connected to the corresponding data inputs/outputs of the DDR memory module 3; and the command bus is connected to the corresponding terminals of the DDR memory module 3 for the command data.

The bus lines of the data bus 2 are connected to the corresponding terminals of the DDR memory module 3 via a switching device 8, which may be driven by a control unit 9. The switching device 8 may be embodied as a changeover switch which, in a first switching state, connects the bus lines of the data bus 2 to the terminals of the DDR memory module 3 in the manner described above.

In a second switching state, the switching device 8 connects the terminals of the DDR memory module 3 to a memory unit 10 (step 220) which provides storage for test mode data for calling up a predefined test mode (step 230). The switching device 8 may be embodied as a semiconductor switch, e.g., by means of field-effect transistors. In one embodiment, it suffices to disconnect (step 210) from the DDR memory module 3 only those bus lines of the data bus 2 which are required to call up the test mode by means of the memory unit 10. Generally, the bus lines for the command bus and for the address bus are required.

The switching device 8 may be changed over between the first switching state and the second switching state by the control unit 9. The control unit 9 may be activated in accordance with a trigger signal at a trigger input 11. The trigger signal brings about the following sequence in the control unit 9. Firstly, the switching device 8 is driven so that the switching device 8 is switched into the second switching state. Afterward, the memory unit 10 is driven by the control unit 9 such that the corresponding test mode data stored therein are output from the memory unit 10 to the DDR memory module 3. This may be carried out by applying the corresponding data via the corresponding terminals for the command bus and the address bus to the DDR memory module 3. Once the test mode data have been completely transmitted, the control unit 9 drives the switching device 8 such that switching back to the first switching state is effected, as a result of which the DDR memory module 3 is connected to the data bus 2 again (step 240).

The transmission of the test mode data from the memory unit 10 to the DDR memory module 3 is generally effected during a short time period, typically within a few microseconds. During this time, the DDR memory module 3 to be analyzed is disconnected from the data bus 2. The switching device 8 may function to avoid the situation in which the test mode data that are to be transmitted from the memory unit 10 to the DDR memory module 3 in the second switching state can pass onto the data bus 2. Since such situation may bring about undesirable states in further connected DDR memory modules 3 or in the memory controller of the data processing unit 1, the temporary disconnection of the DDR memory module 3 from the data bus 2 are effected precisely in a time period in which the data processing unit 1 does not carry out any essential accesses to the DDR memory module 3. The trigger input 11 may be provided for this purpose, via which the changeover can be synchronized with the sequence of an application program in the data processing unit. Without this synchronization, the data processing unit 1 may attempt to carry out essential accesses to the DDR memory module 3 while the DDR memory module 3 is not connected to the data bus 2. Such accesses may then lead to a disturbance of the application in the data processing unit 1, which may become unable to be operated further in a stable manner.

The basic principle according to embodiments of the invention comprises temporarily disconnecting the command bus and the address bus of a DDR memory module 3 from the data bus 2 of a data processing unit 1 and controlling them from a different signal source, namely a memory unit 10 provided for this purpose. This signal source generates the command sequences which activate a desired test mode (step 250) in the memory unit 10. Afterward, the different signal source is disconnected again from the DDR memory module 3, which then becomes connected to the data bus 2 of the data processing unit 1. Temporary changeover may be synchronized with the operation of the application via a trigger input such that the original functionality of said application is preserved.

What is claimed is:

1. An adapter card comprising:
   a first card interface for connecting to an external Double Data Rate (DDR) memory module;
   a second card interface for connecting to a data bus of an external data processing unit;
   a memory unit for storing test mode data;
   a switching device, which, in a first switching state, connects the data bus, via the second card interface, to the first card interface and, in a second switching state, decouples the first card interface from the data bus and connects the memory unit to the first card interface; and
   a control circuit for controlling the switching device between the first and second switching states.

2. The adapter card of claim 1, wherein, in the second switching state, test mode data are transmitted to a connected DDR memory module to call up a test mode in the DDR memory module.

3. The adapter card of claim 1, wherein the control circuit includes a trigger input for receiving a trigger signal for controlling the switching device between the switching states, the trigger input synchronizing a changeover between the first and second switching states with a sequence of an application program in the external data processing unit.

4. The adapter card of claim 3, wherein the control circuit is configured to switch the switching device into the second switching state on reception of the trigger signal and to transmit the test mode data stored in the memory unit to the first card interface via the switching device.

5. The adapter card of claim 4, wherein the control circuit is further configured to switch the switching device into the first switching state after transmitting the test mode data to the first card interface.

6. The adapter card of claim 1, wherein the memory unit is configured to receive test mode data via the data bus from one of the data processing unit and a further data processing unit.

7. The adapter card of claim 1, wherein the data bus comprises one or more of a command bus, a data bus and an address bus.

8. The adapter card of claim 1, wherein, in the second switching state, the memory unit is configured to call up every test mode in the DDR memory module.

9. The adapter card of claim 1, wherein the control circuit initiates the second switching state only in a time period in which the external data processing unit does not carry out any accesses to the external DDR memory module.

10. A method for operating a DDR memory module connected through an adapter card to a data bus of a data processing unit, comprising:
    disconnecting the DDR memory module from the data bus, wherein a switching device disposed in the adapter card switches-off connection between a first card interface of the adapter card which externally connects to the DDR memory module and a second card interface of the adapter card which externally connects to the data bus;
    connecting the DDR memory module to a memory unit of the adapter card having test mode data stored therein;
    transmitting the test mode data to the DDR memory module to call up a test mode in the DDR memory module; and
    activating a test mode of the DDR memory module.

11. The method of claim 10, further comprising:
    reconnecting the data bus to the DDR memory module after transmitting the test mode data.

12. The method of claim 10, wherein the switching device disposed in the adapter card switches between a first switching state which connects the data bus, via the second card interface, to the first card interface which is connected to the DDR memory module and a second switching state which decouples the first card interface from the data bus and connects the memory unit to the first card interface.

13. The method of claim 12, wherein the switching device is controlled by a control unit in the adapter, the control unit configured to receive a trigger signal.

14. The method of claim 10, wherein the DDR memory module operates in one or more test modes and wherein the memory unit includes a plurality of test mode data set.

15. The method of claim 14, wherein the test mode data for defining one or more test modes are provided by the data processing unit.

16. The method of claim 10, wherein the disconnecting is effected in a time period in which the data processing unit does not carry out any access to the DDR memory module.

17. An adapter comprising:
    a first card interface means for connecting to an external Double Data Rate (DDR) memory module;
    a second card interface means for connecting to a data bus of an external data processing unit;
    a storage means for storing test mode data;
    a switching means for switching between a first and second switching state, wherein, in the first switching state, the data bus is connected, via the second card interface means, to the first card interface means and, in a second switching state, the first card interface means is decoupled from the data bus and connected to the storage means; and
    a control means for controlling the switching means between the first and second switching states.

18. The adapter of claim 17, wherein, in the second switching state, test mode data are transmitted to a connected DDR memory module to call up a test mode in the DDR memory module.

19. The adapter of claim 18, wherein the control circuit includes a trigger input means for receiving a trigger signal for controlling the switching means between the switching states.

20. The adapter of claim 19, wherein the control means is configured to switch the switching means into the second switching state on reception of the trigger signal and to transmit the test mode data stored in the storage means to the first card interface means via the switching means.

21. The adapter of claim 20, wherein the control means is further configured to switch the switching means into the first switching state after transmitting the test mode data to the first card interface means.

22. The adapter of claim 21, wherein the storage means is configured to receive test mode data via the data bus from one of the data processing unit and a further data processing unit.

23. The adapter of claim 17, wherein the control means includes a trigger input means for receiving a trigger signal for controlling the switching means, the trigger input means synchronizing a changeover between the first and second switching states with a sequence of an application program in the data processing unit.

* * * * *